(12) United States Patent
Kim

(10) Patent No.: US 7,046,563 B1
(45) Date of Patent: May 16, 2006

(54) PARALLEL COMPRESSION TEST CIRCUIT OF MEMORY DEVICE

(75) Inventor: Taek Seung Kim, Chungcheongbuk-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 0 days.

(21) Appl. No.: 11/115,347

(22) Filed: Apr. 27, 2005

(30) Foreign Application Priority Data

Mar. 29, 2005  (KR) ................. 10-2005-0025969

(51) Int. Cl.
*G11C 29/00* (2006.01)
(52) U.S. Cl. ............. 365/201; 365/230.03; 365/189.04
(58) Field of Classification Search ................ 365/201, 365/230.03, 189.04, 220, 230.06, 185.23
See application file for complete search history.

(56) References Cited

U.S. PATENT DOCUMENTS

| 5,592,425 | A | 1/1997 | Neduva |
| 6,192,001 | B1 | 2/2001 | Weiss et al. |
| 6,297,996 | B1 | 10/2001 | McClure |
| RE38,109 | E | 5/2003 | Merritt et al. |
| 6,693,841 | B1 | 2/2004 | Roohparvar et al. |
| 6,741,511 | B1 | 5/2004 | Nakao |
| 2001/0028583 | A1* | 10/2001 | Tsukude ................. 365/201 |
| 2005/0207245 | A1* | 9/2005 | Kang ..................... 365/201 |

FOREIGN PATENT DOCUMENTS

JP    2000-322900    11/2000

* cited by examiner

*Primary Examiner*—Richard Elms
*Assistant Examiner*—Dang T. Nguyen
(74) *Attorney, Agent, or Firm*—Heller Ehrman LLP

(57) ABSTRACT

A parallel compression test circuit of a memory device operates write drivers sequentially in a parallel compression test to disperse peak current and reduce noise. The circuit comprises a write driving control unit for generating a plurality of write driving control signals in response to a column operation pulse signal at the same timing in a normal mode, at a different timing in the parallel compression test mode.

6 Claims, 6 Drawing Sheets

PARALLEL COMPRESSION TEST CIRCUIT OF MEMORY DEVICE

BACKGROUND OF THE INVENTION

1. Field of the Invention

The present invention generally relates to a parallel compression test circuit of a memory device, and more specifically, to a technology of sequentially operating write drivers in a parallel compression test mode to disperse current and reduce noise.

2. Description of the Related Art

FIG. 1 is a block diagram illustrating a conventional parallel compression test circuit of a memory device.

The conventional parallel compression test circuit comprises a memory unit 10, a write driving unit 20, a write driving control unit 30, a global input/output write driving unit 40 and a data input buffer 50.

The memory unit 10 comprises four banks 12 and four bit line sense amplifiers 14. Here, data on local input/output buses LIOT0~LIOT3 and LIOB0~LIOB3 are stored in the banks 12 through the bit line sense amplifiers 14.

The write driving unit 20 comprises four write drivers 22 corresponding to each bank 12. Each write driver 22 drives data on corresponding one of global input/output lines GIO0~GIO15 to transmit the data to the bit line sense amplifiers 14 of the corresponding bank 12.

The write driving control unit 30 generates a write driving control signal WYP to control the driving operation of the write driving unit 20.

The global input/output write driving unit 40 comprises a plurality of global input/output write drivers 42. Each global input/output write driver 42 drives data Din0~Din15 inputted in response to a test mode signal TPA to transmit the data to the global input/output lines GIO0~GIO15.

The data input buffer unit 50 comprises a plurality of data input buffers 52 for temporarily storing externally inputted data to output the data to the global input/output write driving unit 40.

FIG. 2 is a circuit diagram illustrating the write driving control unit 30 of FIG. 1.

The write driving control unit 30 comprises a delay unit 32 and inverters IV1~IV4. The inverters IV1 and IV2 sequentially inverts a column operation pulse signal YP, and the delay unit 32 delays an output signal from the inverter IV2 for a predetermined time T1.

The inverters IV3 and IV4 sequentially inverts an output signal from the delay unit 32 to generate the write driving control signal WYP.

FIG. 3 is a timing diagram illustrating the operation of the parallel compression test circuit of FIG. 1.

In a parallel compression test mode, a write operation is performed only on the data Din~Din3 corresponding to the number of the banks 12 by the global input/output write driving unit 40.

When the parallel compression test mode signal TPA is enabled, 4–15 of the global input/output write drivers 42 drive the data Din0–Din3 instead of data Din4~Din15 inputted in a normal mode.

That is, the Din0 is driven by the global input/output write drivers 0, 4, 8, 12, the Din1 is driven by the global input/output write drivers 1, 5, 9, 13, the Din2 is driven by the global input/output write drivers 2, 6, 10, 14, and the Din3 is driven by the global input/output write drivers 3, 7, 11, 15.

The data driven by the global input/output write drivers 42 are inputted in the write drivers 22 comprised in each bank 12 through the global input/output lines GIO0~GIO15.

The write drivers 22 drives data on the global input/output lines GIO0~GIO15 in response to the write driving control signal WYP outputted from the write driving control unit 30, and transmits the data to the local input/output lines LIOT0~LIOT3 and LIOB0~LIOB3. Here, the write drivers 22 are simultaneously driven in response to the same write driving control signal WYP.

In other words, the same write driving control signal WYP is applied to all of the write drivers 22 regardless of the banks 12, so that data of 16 bits in each bank 12, which are totaled to 64 bits, are simultaneously written.

As a result, high peak current and noise can be generated because the write drivers 22 of the four banks 12 are simultaneously operated in the parallel test mode rather than in the normal mode.

Although the example where the data of 64 bits are simultaneously outputted by the four banks 12 is illustrated herein, in case of a DDR2 SDRAM, current consumption more increases because data of 256 bits are simultaneously written, thereby generating noise.

SUMMARY OF THE INVENTION

Accordingly, it is an object of the present invention to disperse peak current and reduce noise by operating write drivers in each bank at a different timing.

It is another object of the present invention to improve reliability of a parallel test mode operated in the same way as a normal operation mode.

In an embodiment, a parallel compression test circuit of a memory device comprises a plurality of banks, a plurality of driving units, a plurality of global input/output write driving units, and a write driving control unit. Each of the plurality of banks comprises a plurality of bit line sense amplifiers for sensing and amplifying data on a bit line. The plurality of driving units drive data on a global input/output line in response to a plurality of write driving control signals to transmit the data to the bit line sense amplifier. The plurality of global input/output write driving units drive inputted data to transmit the data to the global input/output line. The write driving control unit generates the plurality of write driving control signals in response to a column operation pulse signal, wherein the plurality of write driving control signals are generated at the same timing in a normal mode and at a different timing in a parallel compression test mode.

BRIEF DESCRIPTION OF THE DRAWINGS

Other aspects and advantages of the present invention will become apparent upon reading the following detailed description and upon reference to the drawings in which.

DETAILED DESCRIPTION OF THE PREFERRED EMBODIMENTS

The present invention will be described in detail with reference to the accompanying drawings.

Figure 1:
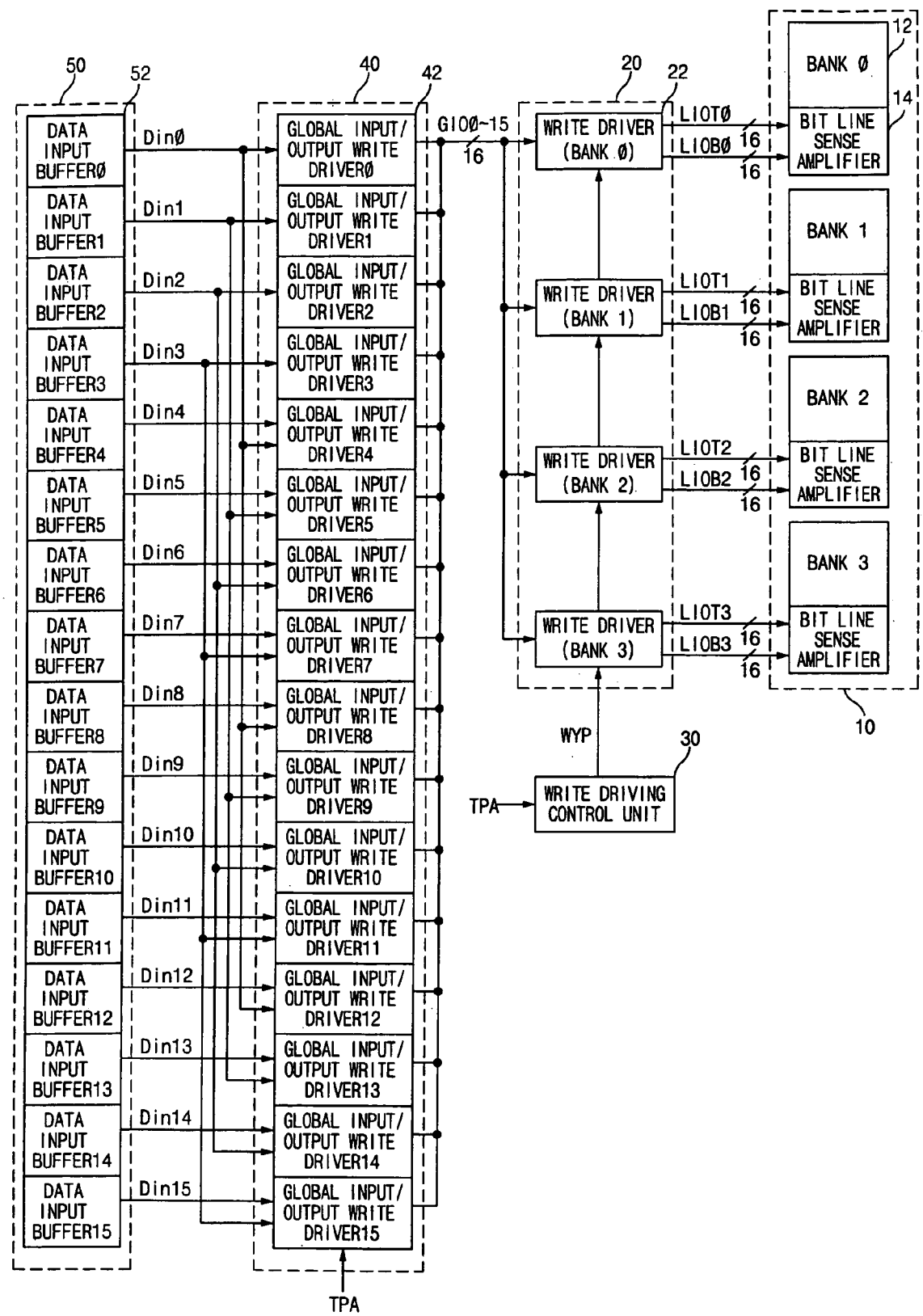
FIG. 1 is a block diagram illustrating a conventional parallel compression test circuit of a memory device.
Figure 2:
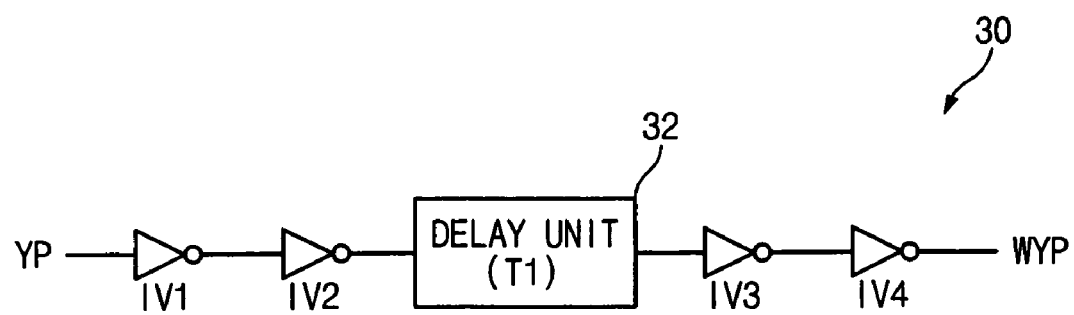
FIG. 2 is a circuit diagram illustrating a write driving control unit of FIG. 1.
Figure 3:
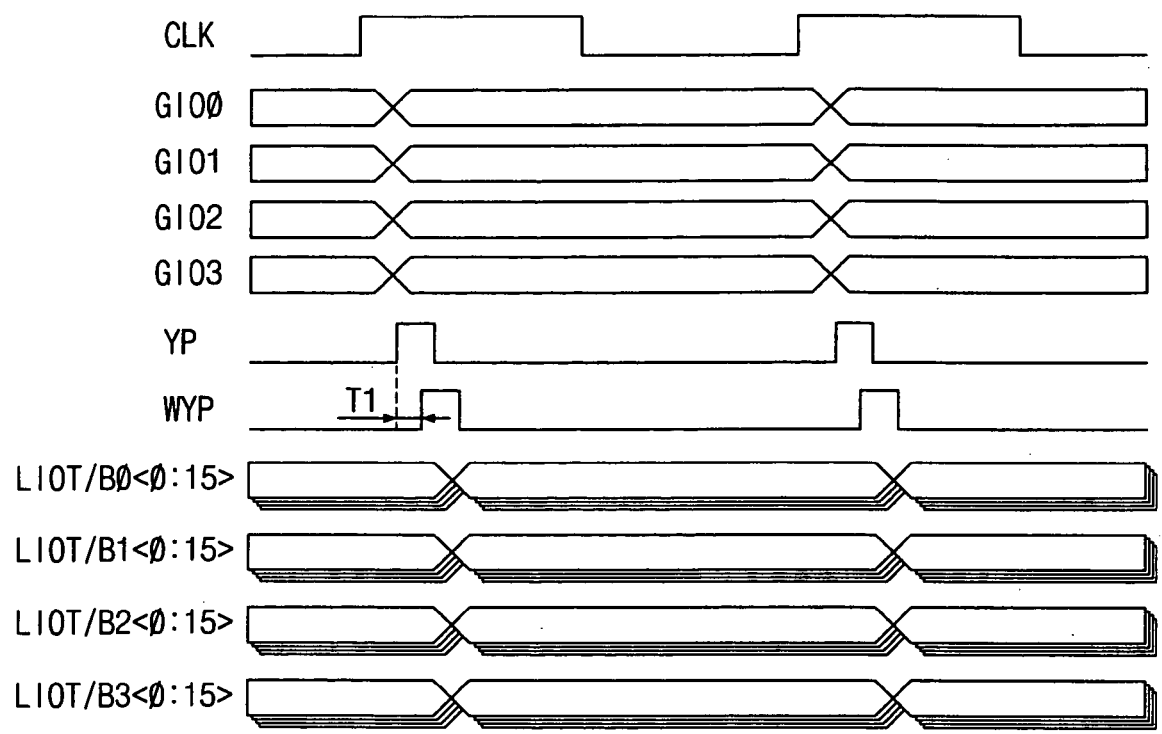
FIG. 3 is a timing diagram illustrating the operation of the parallel compression test circuit of FIG. 1.
Figure 4:
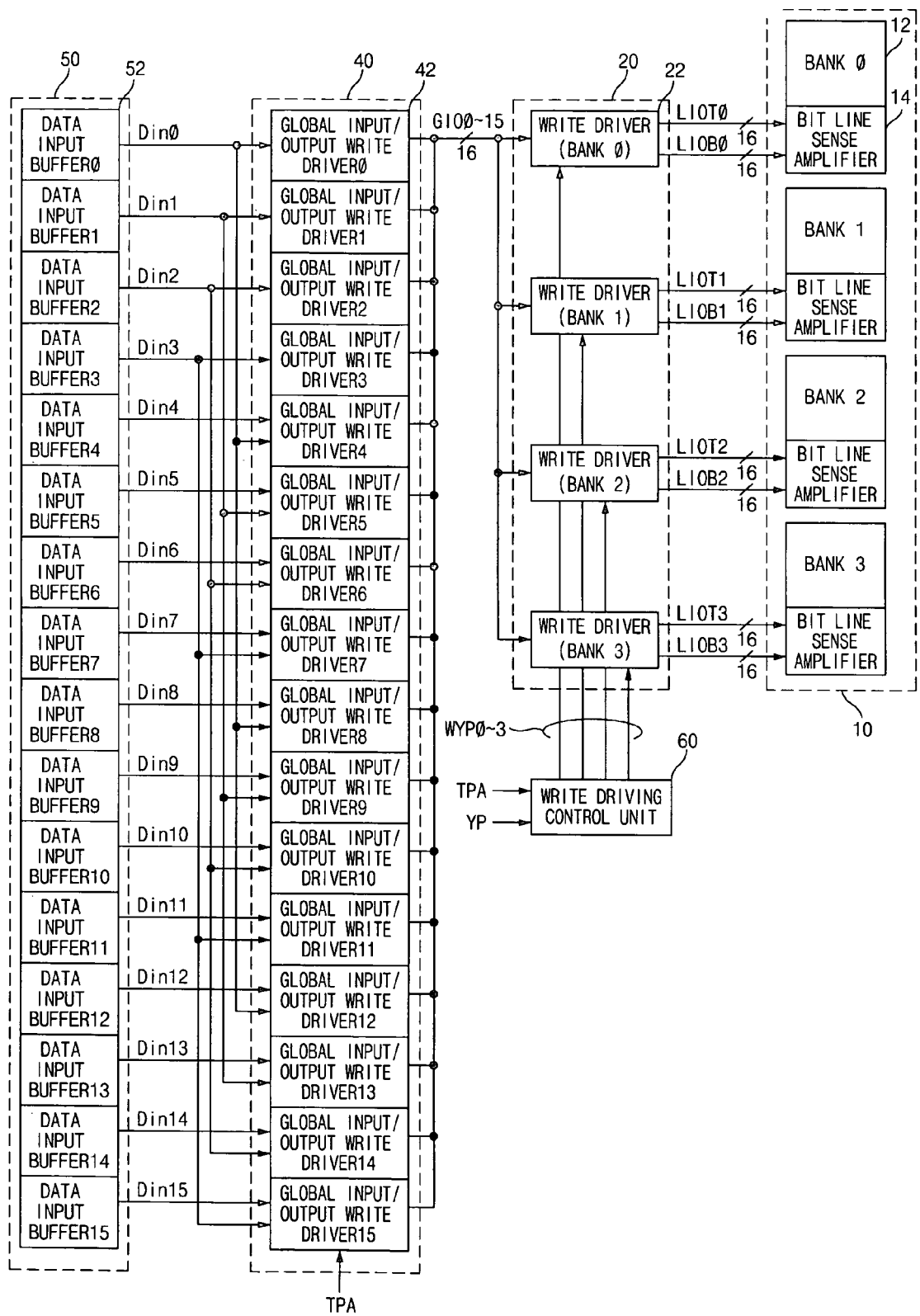
FIG. 4 is a block diagram illustrating a parallel compression test circuit of a memory device according to an embodiment of the present invention.

FIG. 4 is a block diagram illustrating a parallel compression test circuit of a memory device according to an embodiment of the present invention.

In the embodiment, the parallel compression test circuit comprises a memory unit 10, a write driving unit 20, a write driving control unit 60, a global input/output write driving unit 40, and a data input buffer 50.

The memory unit 10 comprises four banks 12 and four bit line sense amplifiers 14. Here, data on local input/output buses LIOT0~LIOT3 and LIOB0~LIOB3 are stored in the banks 12 through the bit line sense amplifiers 14.

The write driving unit 20 comprises four write drivers 22 corresponding to each bank 12. Each write driver 22 drives data on corresponding one of global input/output lines GIO0~GIO15 to transmit the data to the bit line sense amplifiers 14 of the corresponding bank 12.

The write driving control unit 60 generates a write driving control signal WYP to control the driving operation of the write driving unit 20.

The global input/output write driving unit 40 comprises a plurality of global input/output write drivers 42. Each global input/output write driver 42 drives data Din0~Din15 inputted in response to a test mode signal TPA to transmit the data to the global input/output lines GIO0~GIO15.

The data input buffer unit 50 comprises a plurality of data input buffers 52 for temporarily storing externally inputted data to output the data to the global input/output write driving unit 40.

Figure 5:
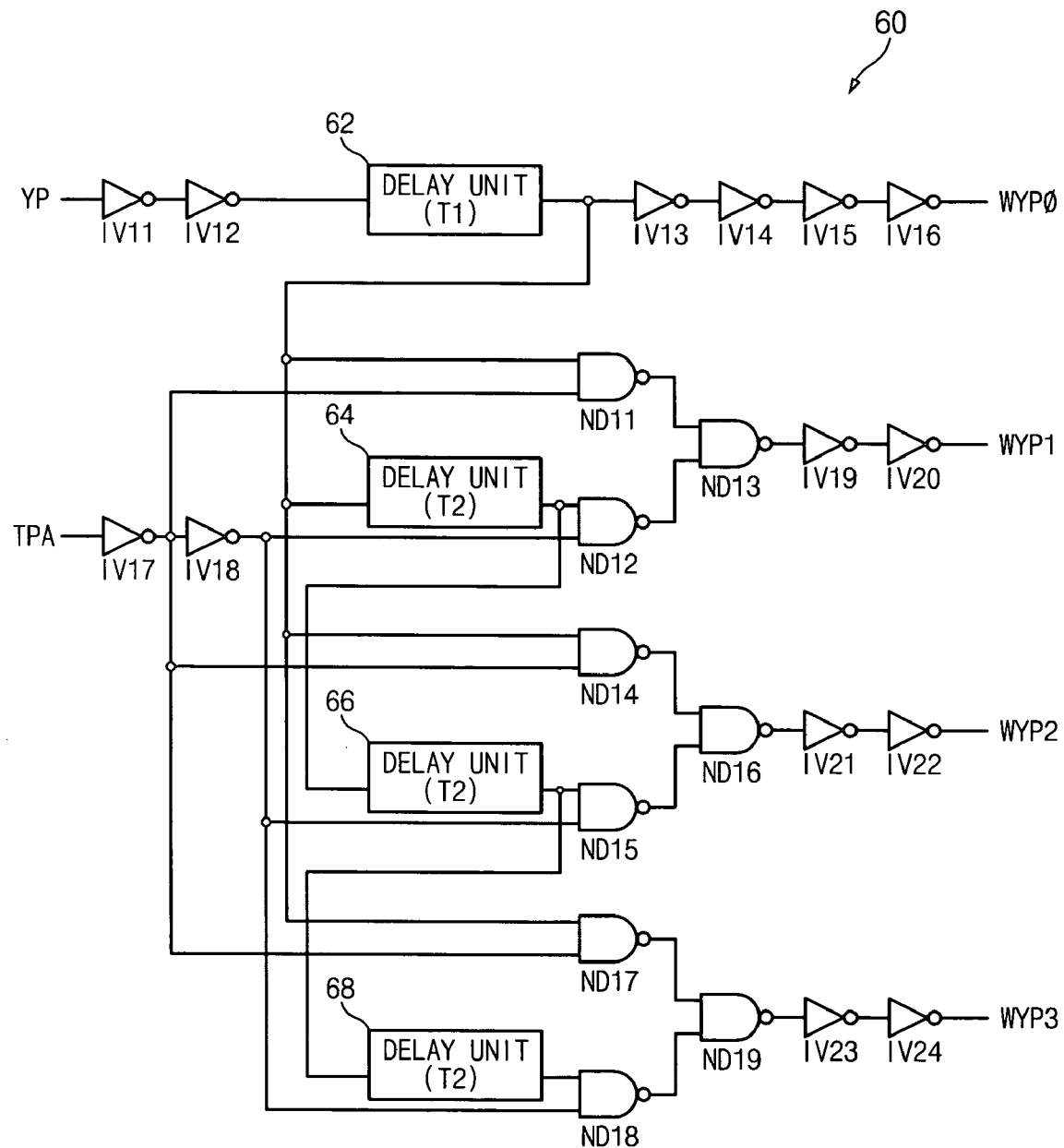
FIG. 5 is a circuit diagram illustrating a write driving control unit of FIG. 4.

FIG. 5 is a circuit diagram illustrating a write driving control unit 60 of FIG. 4.

The write driving control unit 60 comprises a delay unit T1 62, delay units T2 64, 66, 68, NAND gates ND11~ND19, and inverters IV11~IV24.

The inverters IV11 and IV12 sequentially invert a column operation pulse signal YP, and the delay unit 62 delays an output signal from the inverter IV12 for a predetermined time T1.

The inverters IV13~IV16 sequentially invert an output signal from the delay unit 62 to generate a first write driving control signal WYP0.

The inverters IV17 and IV18 sequentially inverts a parallel compression test mode signal TPA.

The NAND gate ND11 performs a NAND operation on output signals from the delay unit 62 and the inverter IV17. The delay unit 64 delays an output signal from the delay unit 62 for a predetermined time T2, and the NAND gate ND12 performs a NAND operation on output signals from the delay unit 64 and the inverter IV18. The NAND gate ND13 performs a NAND operation on output signals from the NAND gates ND11 and ND12. The inverters IV19 and IV20 sequentially invert an output signal from the NAND gate ND13 to output a second write driving control signal WYP1.

The NAND gate ND14 performs a NAND operation on output signals from the delay unit 62 and the inverter IV17. The delay unit 66 delays an output signal from the delay unit 64 for the predetermined time T2, and the NAND gate ND15 performs a NAND operation on output signals from the delay unit 66 and the inverter IV18. The NAND gate ND16 performs a NAND operation on output signals from the NAND gates ND14 and ND15. The inverters IV21 and IV22 sequentially an output signal from the NAND gate ND16 to output a third write driving control signal WYP2.

The NAND gate ND17 performs a NAND operation on output signals from the delay unit 62 and the inverter IV17. The delay unit 68 delays an output signal from the delay unit 66 for the predetermined time T2. The NAND gate ND18 performs a NAND operation on output signals from the delay unit 68 and the inverter IV18. The NAND gate ND19 performs a NAND operation on output signals from the NAND gates ND17 and ND18. The inverters IV23 and IV24 sequentially invert an output signal from the NAND gate ND19 to output a fourth write driving control signal WYP3.

Figure 6:
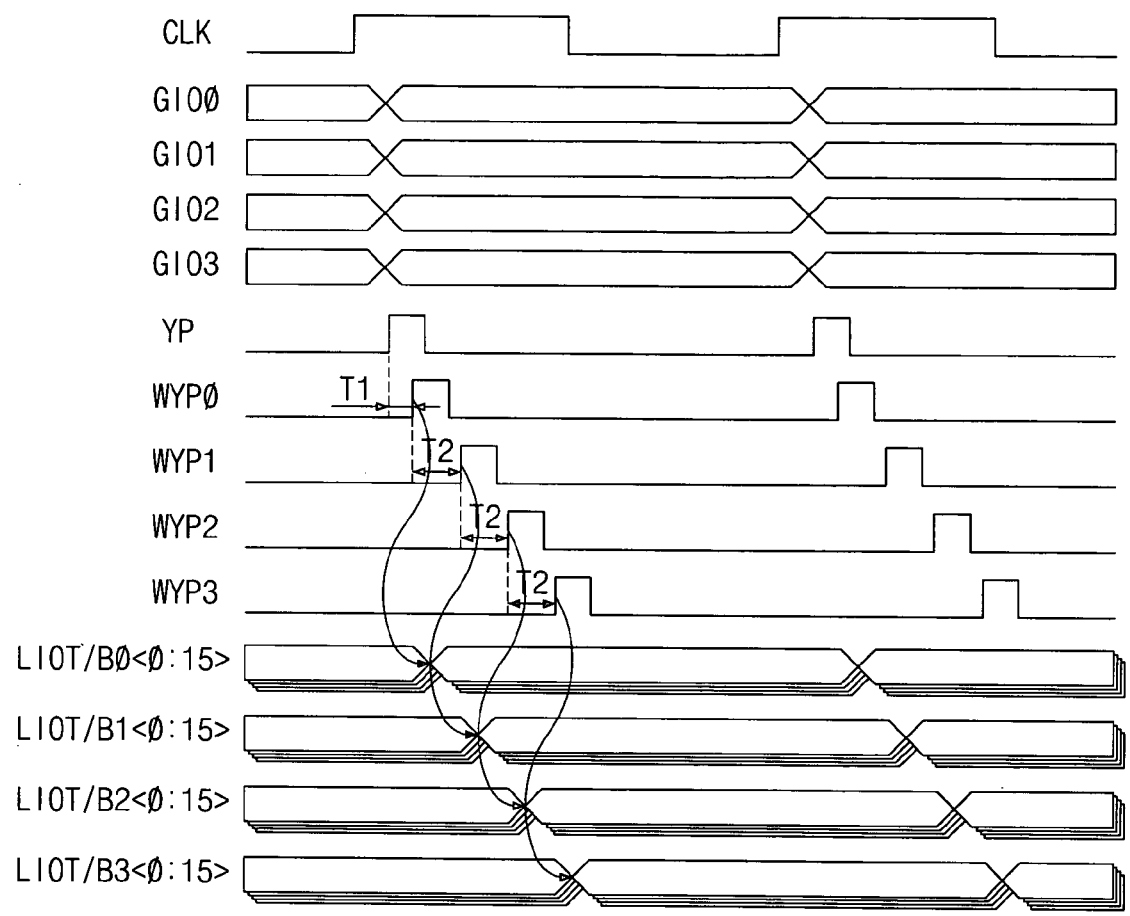
FIG. 6 is a timing diagram illustrating the operation of the parallel compression test circuit of FIG. 5.

FIG. 6 is a timing diagram illustrating the operation of the parallel compression test circuit of FIG. 5.

The write driving control unit 60 generates the first through the fourth write driving control signals WYP0~WYP3 obtained by sequentially delaying the column operation pulse signal YP in the delay units 62~68.

Although the example where the first through the fourth write driving control signals WYP0~WYP3 are sequentially generated is illustrated herein, the signals can be set to be generated at a different timing, respectively.

In a normal operation mode, the first through the fourth write driving control signals WYP0~WYP3 are generated at the same timing, so that the write driver 42 drives data on the global input/output lines GIO0~GIO15 to transmit the data to the bit line sense amplifier 14 corresponding to the selected bank 12 through the local input/output lines LIOT0~LIOT15 and LIOB0~LIOB15.

Meanwhile, in a parallel compression test mode, the first through the fourth write driving control signals WYP0~WYP3 are sequentially generated, so that the write driver 42 sequentially drives data on the global input/output lines GIO0~GIO15 in each bank 12 to transmit the data to the bit line sense amplifiers 14 of the banks 12 through the local input/output lines LIOT0~LIOT15 and LIOB0~LIOB15.

Although the example where the first through the fourth write driving control signals WYP0~WYP3 are generated at a different timing in each bank 12 is illustrated herein, the write drivers 22 corresponding to each bank 12 can be driven in a group if necessary.

As described above, a parallel compression test circuit of a memory device according to an embodiment of the present invention operates write drivers in each bank at a different timing, thereby disperse peak current and reducing noise.

Additionally, the reliability of a parallel test mode can be improved because the parallel compression test circuit can reduce a difference of test results in a normal mode and a parallel test mode.

While the invention is susceptible to various modifications and alternative forms, specific embodiments have been shown by way of example in the drawings and described in detail herein. However, it should be understood that the invention is not limited to the particular forms disclosed. Rather, the invention covers all modifications, equivalents, and alternatives falling within the spirit and scope of the invention as defined in the appended claims.

What is claimed is:

1. A parallel compression test circuit of a memory device, comprising:
   a plurality of banks each comprising a plurality of bit line sense amplifiers for sensing and amplifying data on a bit line;
   a plurality of driving units for driving data on a global input/output line in response to a plurality of write driving control signals to transmit the data to the bit line sense amplifier;

a plurality of global input/output write driving units for driving inputted data to transmit the data to the global input/output line; and a write driving control unit for generating the plurality of write driving control signals in response to a column operation pulse signal, wherein the plurality of write driving control signals are generated at the same timing in a normal mode and at a different timing in a parallel compression test mode.

2. The parallel compression test circuit according to claim 1, wherein the write driving control unit comprises:

a plurality of first delay units for sequentially delaying the column operation pulse signal; and a plurality of write driving control signal generating units for generating the plurality of write driving control signals with output signals from the plurality of first delay units in response to a parallel compression test mode signal.

3. The parallel compression test circuit according to claim 2, wherein the plurality of first delay units have the same delay time.

4. The parallel compression test circuit according to claim 2, wherein the write driving control unit comprises a normal mode control unit for controlling the plurality of write driving control signals to be generated at the same timing in response to the parallel compression test mode signal in the normal mode.

5. The parallel compression test circuit according to claim 1, wherein the write driving control unit comprises:

a second delay unit for delaying the column operation pulse signal at a different delay time; and a plurality of write driving control signal generating units for generating the plurality of write driving control signals with output signals from the plurality of second delay units in response to a parallel compression test mode signal.

6. The parallel compression test circuit according to claim 5, wherein the write driving control unit comprises a normal mode control unit for controlling the plurality of write driving control signals to be generated at the same timing in response to the parallel compression test mode signal in the normal mode.

* * * * *